United States Patent
Lee et al.

(10) Patent No.: US 11,848,040 B2
(45) Date of Patent: Dec. 19, 2023

(54) MEMORY DEVICE AND REFERENCE CIRCUIT THEREOF

(71) Applicant: TAIWAN SEMICONDUCTOR MANUFACTURING CO., LTD., Hsinchu (TW)

(72) Inventors: Chia-Fu Lee, Hsinchu (TW); Yu-Der Chih, Hsinchu (TW); Hon-Jarn Lin, New Taipei (TW); Yi-Chun Shih, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 63 days.

(21) Appl. No.: 17/559,998

(22) Filed: Dec. 22, 2021

(65) Prior Publication Data

US 2022/0115051 A1    Apr. 14, 2022

Related U.S. Application Data

(60) Continuation of application No. 16/715,682, filed on Dec. 16, 2019, now Pat. No. 11,211,106, which is a (Continued)

(51) Int. Cl.
*G11C 5/06* (2006.01)
*G11C 11/16* (2006.01)
(Continued)

(52) U.S. Cl.
CPC .......... *G11C 11/1673* (2013.01); *G11C 7/062* (2013.01); *G11C 7/22* (2013.01);
(Continued)

(58) Field of Classification Search
CPC ..... G11C 11/1673; G11C 13/004; G11C 7/22; G11C 2013/0045; G11C 2207/063; G11C 2013/0054; G11C 2013/0057
See application file for complete search history.

(56) References Cited

U.S. PATENT DOCUMENTS 6,388,932 B2   5/2002   Kohno
6,700,811 B1   3/2004   Weng et al.
(Continued)

FOREIGN PATENT DOCUMENTS

CN     1681040 A    10/2005
CN     1819061 A     8/2006
(Continued)

*Primary Examiner* — Uyen Smet
(74) *Attorney, Agent, or Firm* — Maschoff Brennan

(57) ABSTRACT

A device includes first and second reference storage units, and first and second reference switches. The first reference switch outputs a first current at a first terminal thereof to the first reference storage unit. The first reference storage unit receives the first current at a first terminal thereof and generates a first signal, according to the first current, at a second terminal thereof to an average current circuit. The second reference switch outputs a second current at a first terminal thereof to the second reference storage unit. The second reference storage unit receives the second current at a first terminal thereof, and generates a second signal, according to the second current, at a second terminal thereof to the average current circuit. The first and second reference switches are coupled to a plurality of first memory cells by a first word line.

20 Claims, 8 Drawing Sheets

Related U.S. Application Data continuation of application No. 16/217,323, filed on Dec. 12, 2018, now Pat. No. 10,515,680, which is a continuation of application No. 15/667,600, filed on Aug. 2, 2017, now Pat. No. 10,157,654, which is a division of application No. 14/929,076, filed on Oct. 30, 2015, now Pat. No. 9,754,639.

(51) Int. Cl.
  *G11C 13/00* (2006.01)
  *G11C 7/06* (2006.01)
  *G11C 7/22* (2006.01)

(52) U.S. Cl.
  CPC .......... *G11C 11/161* (2013.01); *G11C 13/004* (2013.01); *G11C 2013/0045* (2013.01); *G11C 2013/0054* (2013.01); *G11C 2013/0057* (2013.01); *G11C 2207/063* (2013.01)

(56) References Cited

U.S. PATENT DOCUMENTS

| | | |
|---|---|---|
| 6,845,052 B1 | 1/2005 | Ho et al. |
| 7,054,197 B2 | 5/2006 | Vimercati |
| 7,952,916 B2 | 5/2011 | Maeda et al. |
| 8,094,493 B2 | 1/2012 | Hsieh et al. |
| 8,320,166 B2 | 11/2012 | Park et al. |
| 8,687,412 B2 | 4/2014 | Chih et al. |
| 2002/0163844 A1 | 11/2002 | Kurjanowicz |
| 2004/0042249 A1 | 3/2004 | Weng et al. |
| 2005/0157541 A1 | 7/2005 | Iwata |
| 2006/0028889 A1 | 2/2006 | Liaw |
| 2006/0050584 A1 | 3/2006 | Gogl et al. |
| 2006/0067149 A1* | 3/2006 | Shimizu .............. G11C 11/16 365/210.1 |
| 2006/0077740 A1 | 4/2006 | Lee et al. |
| 2006/0227598 A1 | 10/2006 | Sakimura et al. |
| 2007/0195626 A1 | 8/2007 | Kim et al. |
| 2007/0230263 A1 | 10/2007 | Sakakibara |
| 2008/0002481 A1 | 1/2008 | Gogl |
| 2009/0067212 A1* | 3/2009 | Shimizu .............. G11C 11/16 365/158 |
| 2010/0067282 A1 | 3/2010 | Liu et al. |
| 2014/0119105 A1 | 5/2014 | Jan et al. |
| 2014/0185361 A1* | 7/2014 | Oh .................. G11C 13/0002 365/148 |
| 2014/0204652 A1 | 7/2014 | Lee et al. |
| 2015/0262622 A1 | 9/2015 | Iizuka et al. |
| 2015/0262701 A1 | 9/2015 | Takizawa |
| 2015/0318033 A1 | 11/2015 | Kajigaya |
| 2016/0172032 A1 | 6/2016 | Matsuoka |

FOREIGN PATENT DOCUMENTS

| | | |
|---|---|---|
| CN | 101388246 A | 3/2009 |
| CN | 104134460 A | 11/2014 |
| JP | 2008-502091 A | 1/2008 |
| TW | 200741733 A | 11/2007 |
| TW | 201351739 A | 12/2013 |
| WO | 2006027373 A1 | 3/2006 |

* cited by examiner

MEMORY DEVICE AND REFERENCE CIRCUIT THEREOF

RELATED APPLICATIONS

The present application is a continuation application of the U.S. application Ser. No. 16/715,682, filed Dec. 16, 2019, now U.S. Pat. No. 11,211,106, issued Dec. 28, 2021, which is a continuation application of the U.S. application Ser. No. 16/217,323, filed Dec. 12, 2018, now U.S. Pat. No. 10,515,680, issued Dec. 24, 2019, which is a continuation application of the U.S. application Ser. No. 15/667,600, filed Aug. 2, 2017, now U.S. Pat. No. 10,157,654, issued Dec. 18, 2018, which is a divisional application of the U.S. application Ser. No. 14/929,076, filed Oct. 30, 2015, now U.S. Pat. No. 9,754,639, issued Sep. 5, 2017, all of which are herein incorporated by reference.

BACKGROUND

Memory devices have been widely utilized in many applications. In various applications, the memory devices include a volatile memory and a non-volatile memory that is applicable for long term data storage. For example, the non-volatile memory includes the non-volatile memory includes an eFuse, an electrically-erasable programmable read-only memory (EEPROM), a flash memory, or a magneto resistive random-access memory (MRAM). A robust reference scheme is required to adequately read data stored in memory cells of the non-volatile memory.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
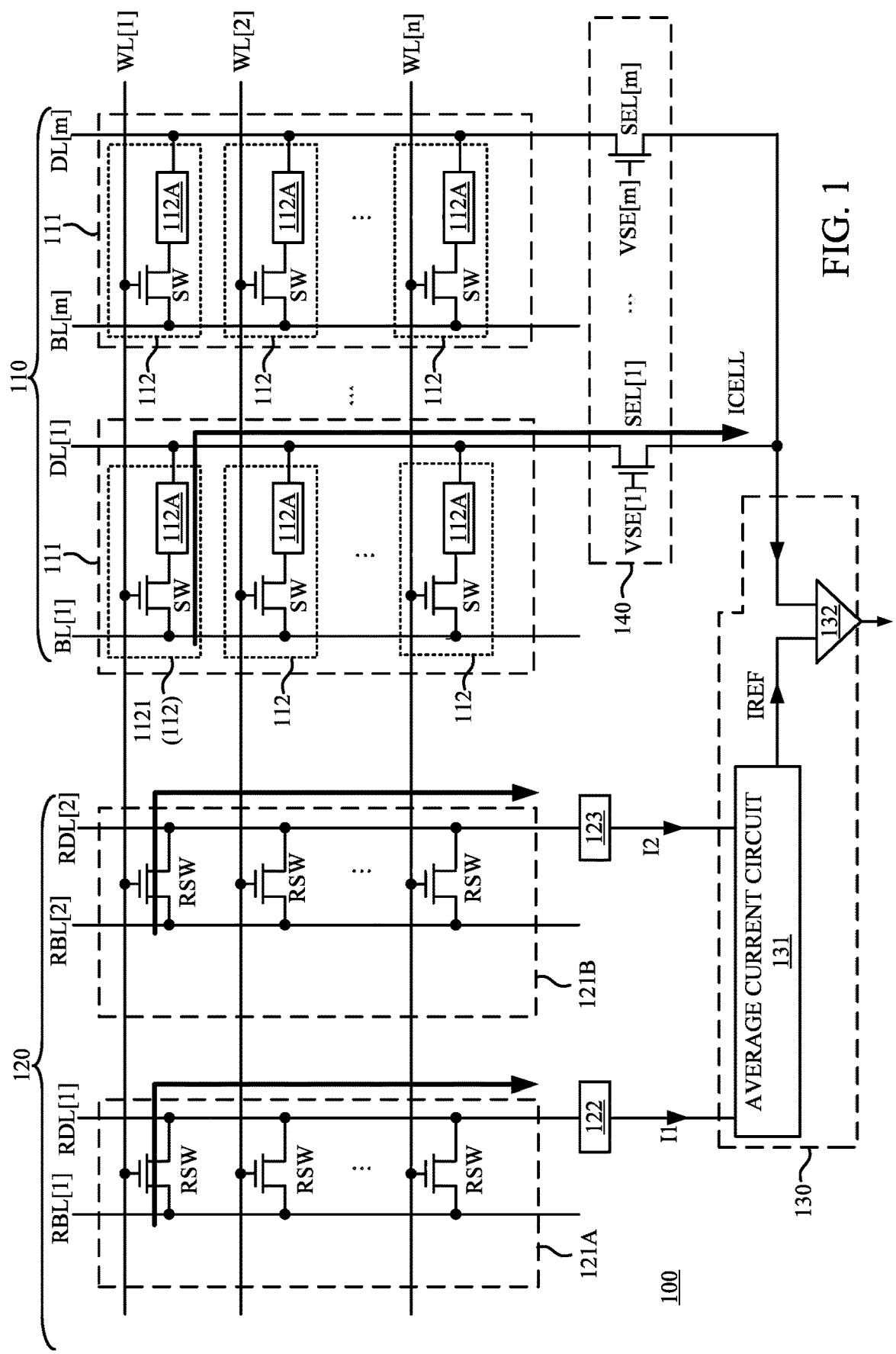
FIG. 1 is a schematic diagram of a device, in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

FIG. 1 is a schematic diagram of an electronic device 100 in accordance with various embodiment of the present disclosure.

As illustratively shown in FIG. 1, the electronic device 100 includes a memory array 110, a reference circuit 120, a sensing unit 130, and a selection circuit 140. The memory array 110 includes memory columns 111, bit lines BL[1]-BL[m], word lines WL[1]-WL[n], and data lines DL[1]-DL[m], in which n and m are positive integers.

For illustration, the memory columns 111 are disposed in parallel with each other. Each memory column 111 includes n memory cells 112. Each n memory cells 112 include a switch SW and a storage unit 112A. The switch SW is coupled to a corresponding one of the word lines WL[1]-WL[n] and a corresponding one of the bit lines BL[1]-BL[m]. The storage unit 112A is coupled between the switch SW and a corresponding one of the data lines DL[1]-DL[m]. Each of the storage units 112A is configured to store bit data.

The reference circuit 120 is disposed at a side of the memory array 110. The reference circuit 120 includes reference switches RSW, a reference storage unit 122, a reference storage unit 123, reference bit lines RBL[1]-RBL[2], and reference data lines RDL[1]-RDL[2]. The reference switches RSW are disposed in rows and columns. For illustration, the reference switches RSW are arranged in two columns 121A and 121B. First terminals of the reference switches RSW in the column 121A are coupled to the reference bit line RBL[1], second terminals of the reference switches RSW in the column 121A are coupled to the reference data line RDL[1], and control terminals of the reference switches RSW in the column 121A are coupled to the word lines WL[1]-WL[n], respectively. The reference storage unit 122 is coupled between the reference data line RDL[1] and the sensing unit 130, and configured to store bit data having a logic high state. Accordingly, when one of the reference switches RSW in the column 121A is turned on, the reference storage unit 122 is then biased to transmit the signal I1 having the logic high state according to the stored bit data. First terminals of the reference switches RSW in the column 121B are coupled to the reference bit line RBL[2], second terminals of the reference switches RSW in the column 121B are coupled to the reference data line RDL[2], and control terminals of the reference switches RSW in the column 121B are coupled to the word lines WL[1]-WL[n], respectively. The reference storage unit 123 is coupled between the reference data line RDL[2] and the sensing unit 130, and configured to store bit data having a logic low state. Accordingly, when one of the reference switches RSW in the column 121B is turned on, the reference storage unit 123 is then biased to generated signal I2 having the logic low state according to the stored bit data.

In some embodiments, the storage units 112A, the reference storage unit 122 and the reference storage unit 123 are implemented with non-volatile memory devices. In further embodiments, the non-volatile memory devices include resistive random-access memory (RRAM) device. The resistance of the RRAM device is able to be adjusted to present the bit data having the logic high state or the logic low state. In some other embodiments, the non-volatile memory devices include magnetic tunnel junction (MTJ) devices. The magneto resistance of the MTJ device is able to be adjusted to present the bit data having the logic high state or the logic low state.

The implementations of the storage units 112A, the reference storage unit 122 and the reference storage unit 123 are given for illustrative purposes only. Various implementations of the storage units 112A, the reference storage unit 122 and the reference storage unit 123 are within the contemplated scope of the present disclosure.

In some embodiments illustrated in FIG. 1, during a read operation, a corresponding one of the word lines WL[1]-WL[n] is activated. Accordingly, two reference switches RSW in the columns 121A and 121B, which are coupled to the activated one of the word lines WL[1]-WL[n], are turned on. The reference storage unit 122 then generates the signal I1 to the sensing unit 130, and the reference storage unit 123 then generates the signal I2 to the sensing unit 130. As a result, the sensing unit 130 is able to determine a logic state of the bit data of the selected one of the n memory cells 112 according to the signals I1 and I2. The detailed operations are described below with reference to FIG. 2.

Furthermore, the selection circuit 140 includes switches SEL[1]-SEL[m]. First terminals of the switches SEL[1]-SEL[m] are coupled to the data lines DL[1]-DL[m], respectively, second terminals of the switches SEL[1]-SEL[m] are coupled to the sensing unit 130, and control terminals of the switches SEL[1]-SEL[m] are configured to receive selection signals VSE[1]-VSE[m]. During the read operation, one of the switches SEL[1]-SEL[m] is turned on, and one of the word lines WL[1]-WL[n] is activated. Accordingly, the switch SW, which is coupled to the activated one of the word lines WL[1]-WL[n], are turned on by the corresponding one of the selection signals VSE[1]-VSE[m]. A current ICELL, indicating the bit data of the selected one of the n memory cells 112, is then transmitted to the sensing unit 130. Accordingly, the bit data of the selected memory cell 112 is able to be determined by the sensing unit 130.

The sensing unit 130 is coupled to the memory array 110 and the reference circuit 120. The sensing unit 130 is configured to determine the logic state of the bit data of the selected memory cell 112 according to the signals I1 and I2. For illustration, in some embodiments illustrated in FIG. 1, the sensing unit 130 includes an average current circuit 131 and a sense amplifier 132. Input terminals of the average current circuit 131 are coupled to the reference storage units 122 and 123 to receive the signals I1 and I2. A first input terminal of the sense amplifier 132 is coupled to an output terminal of the average current circuit 131 to receive a reference signal IREF. A second input terminal of the sense amplifier 132 is coupled to the switches SEL[1]-SEL[m] to receive the current ICELL. The average current circuit 131 is configured to average the signals I1 and I2 to generate the reference signal IREF. The sense amplifier 132 is configured to compare the reference signal IREF with the current ICELL, in order to determine the logic state of the bit data. In some embodiments, the average current circuit 131 is implemented with various types of current mirror circuit.

Figure 2:
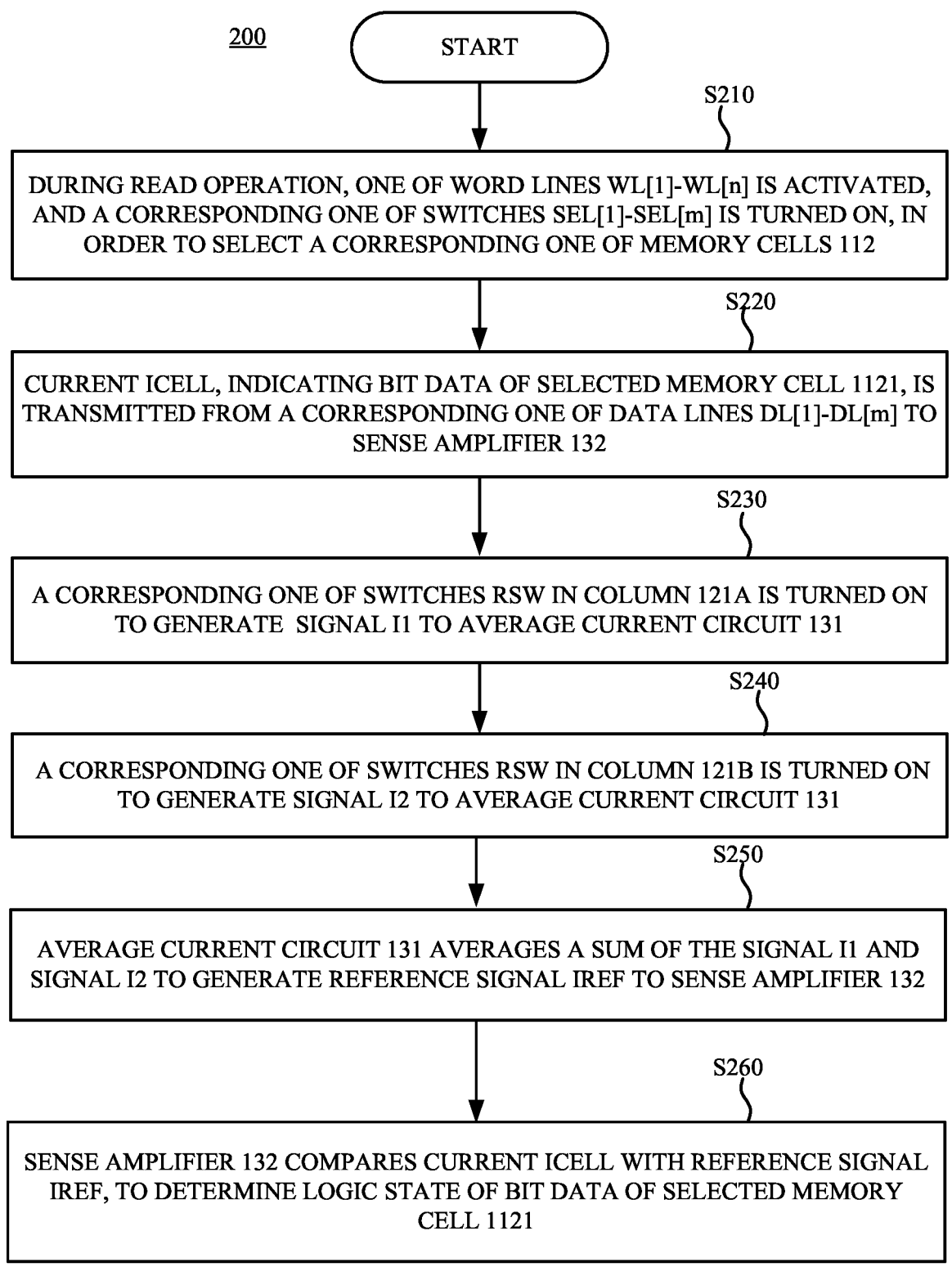
FIG. 2 is a flow chart of a method illustrating operations of the electronic device in FIG. 1, in accordance with various embodiments of the present disclosure.

FIG. 2 is a flow chart of a method 200 illustrating operations of the electronic device 100 in FIG. 1, in accordance with various embodiments of the present disclosure. For illustration, the operations of the device 100 in FIG. 1 are described by the method 200 with reference to FIG. 2. In some embodiments, the method 200 includes operations S210-S260.

In operation S210, during a read operation, one of the word lines WL[1]-WL[n] is activated, and a corresponding one of the switches SEL[1]-SEL[m] is turned on, in order to select a corresponding one of the memory cells 112.

In operation S220, the current ICELL, indicating the bit data of the selected memory cell 112, is transmitted from a corresponding one of the data lines DL[1]-DL[m] to the sense amplifier 132.

For illustration, as illustrated in FIG. 1, during the read operation, the first word line WL[1] is activated, the switch SEL[1] is turned on by the selection signal VSE[1], and the other switches SEL[2]-SEL[m] are turned off by the selection signals VSE[2]-VSE[m]. Accordingly, the memory cell 112 (hereinafter the selected memory cell 1121) coupled to the word line WL[1] and the data line DL[1] is selected. The switch SW of the selected memory cell 1121 is then turned on to bias the storage unit 112A of the selected memory cell 1121. Thus, the current ICELL, which is able to indicate the bit data stored in the storage unit 112A, is transmitted from the storage unit 112A to the sense amplifier 132 via the data line DL[1] and the switch SEL[1].

With continued reference to FIG. 2, in operation S230, a corresponding one of the switches RSW in the column 121A is turned on to generate the signal I1 to the average current circuit 131. In operation S240, a corresponding one of the switches RSW in the column 121B is turned on to generate the signal I2 to the average current circuit 131. In operation S250, the average current circuit 131 averages the sum of the signal I1 and the signal I2 to generate the reference signal IREF to the sense amplifier 132. In operation S260, the sense amplifier 132 compares the current ICELL with the reference signal IREF, to determine the logic state of the bit data of the selected memory cell 1121.

For illustration in FIG. 1, when the word line WL[1] is activated, the reference switches RSW in the columns 121A and 121B, which are coupled to the word line WL[1], are turned on. Accordingly, the reference storage units 122 and 123 are biased by the turn-on reference switches RSW, to generate the signals I1 and I2 to the average current circuit 131. The average current circuit 131 then averages the signals I1 and I2, to generate the reference signal IREF to the sense amplifier 132. In other words, the level of the reference signal IREF is about half of a sum of the signals I1 and I2. The sense amplifier 132 then compares the current ICELL with the reference signal IREF, to determine the logic state of the bit data of the selected memory cell 1121. For example, when the current ICELL is higher than the reference signal IREF, the bit data of the selected memory cell 1121 is determined to have the logic high state. Alternatively, when the current ICELL is lower than the reference signal IREF, the bit data of the selected memory cell 1121 is determined to have the logic low state. Effectively, the bit data of the selected memory cell 1121 is read by the electronic device 100.

The above description includes exemplary operations, but the operations are not necessarily performed in the order described. The order of the operations disclosed in the present disclosure are able to be changed, or the operations are able to be executed simultaneously or partially simultaneously as appropriate, in accordance with the spirit and scope of various embodiments of the present disclosure.

In some embodiments, the reference switches RSW and the switch SW in the n memory cells 112 are configured to have a same feature size. Thus, process/voltage/temperature variations on the memory array 110 are similar to those on the reference circuit 120, and accordingly, the reference circuit 120 is able to be utilized to detect process/voltage/temperature variations on the memory array 110. For illustration, with the arrangements of the switches RSW in FIG. 1, the reference circuit 120 is able to track the variations of the wire loading of the memory array 110, for example, including the bit lines BL[1]-BL [m], the switches SW coupled to the bit lines BL[1]-B[m], data lines DL[1]-D L [m], etc. Thus, the reference signal IREF is able to be generated with the similar variations on the memory array 110.

Compared to some approaches using an external fixed reference signal, a more accurate reference signal IREF is generated by the reference circuit 120, as illustrated in the embodiments of FIG. 1.

Moreover, in some other approaches, a reference circuit employs the same architecture of the memory array 110. In such approaches, the bit data stored in reference storage units of the reference circuit are varied with each other due to various variations between the reference storage units. As a result, the reference signal generated by the reference circuit in such approaches is inaccurate.

Compared with the approaches described above, as illustrated in FIG. 1, the reference switches RSW in the column 121A are coupled to the single reference storage unit 122, and the reference switches RSW in the column 121B are coupled to the single reference storage unit 123. Effectively, the variations between the storage units in the reference circuit 120 are minimized. As a result, a more accurate reference signal IREF is able to be generated, compared with the aforementioned approaches.

Figure 3A:
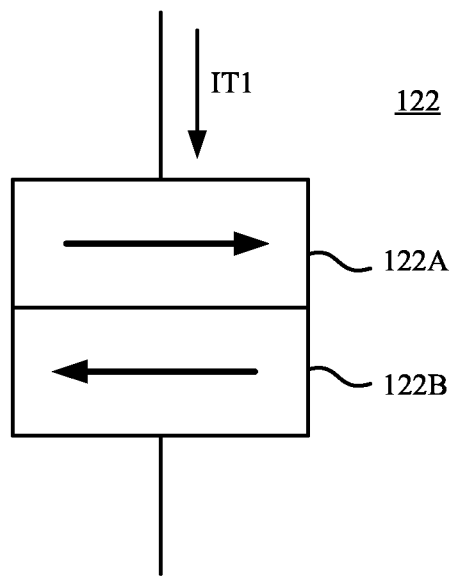
FIG. 3A is a schematic diagram of the reference storage unit in FIG. 1 having the logic high state, in accordance with various embodiments of the present disclosure.

Reference is now made to FIG. 3A. FIG. 3A is a schematic diagram of the reference storage unit 122 in FIG. 1 having the logic high state, in accordance with various embodiments of the present disclosure.

As described above, in some embodiments, the reference storage units 122 and 123 are implemented with the MTJ devices. In some embodiments, the MTJ device includes a free layer and a pinned layer. As illustratively shown in FIG. 3A, the reference storage unit 122 includes a free layer 122A and a pinned layer 123B. The free layer 122A of the reference storage unit 122 is coupled to a first terminal of the reference storage unit 122, and the pinned layer 122B is coupled to a second terminal of the reference storage unit 122. In some embodiments, the reference storage unit 122 is configured to receive a current IT1 flowing from its first terminal, i.e., the free layer 122A, to its second terminal, i.e., the pinned layer 122B. Accordingly, as shown in FIG. 3A, the magnet moment of the free layer 122A is anti-parallel to the magnet moment of the pinned layer 122B. Under this condition, the reference storage unit 122 is configured to have a high magneto resistance. Effectively, the reference storage unit 122 is programmed to have the bit data having the logic high state.

Figure 3B:
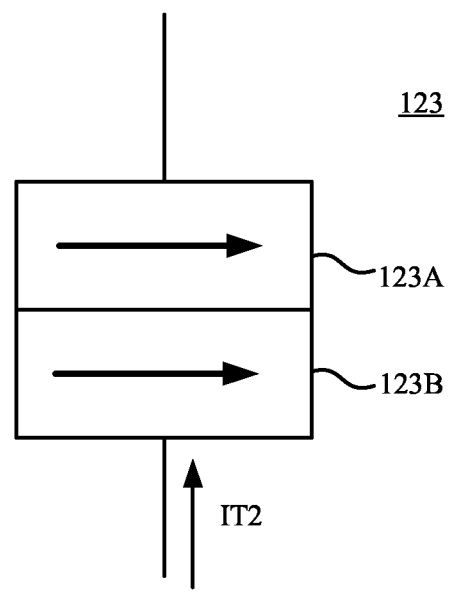
FIG. 3B is a schematic diagram of the reference storage unit in FIG. 1 having the logic low state, in accordance with various embodiments of the present disclosure.

FIG. 3B is a schematic diagram of the reference storage unit 123 in FIG. 1 having the logic low state, in accordance with various embodiments of the present disclosure. Corresponding to the reference storage unit 122, as illustrated in some embodiments in FIG. 3B, the reference storage unit 123 includes a free layer 123A and a pinned layer 123B. The free layer 123A is coupled to the first terminal of the reference storage unit 123. The pinned layer 123B is coupled to the second terminal of the reference storage unit 123. In some embodiments, the reference storage unit 123 is configured to receive a current IT2 flowing from its second terminal, i.e., the pinned layer 123B, to its second terminal, i.e., the free layer 123A. Accordingly, as shown in FIG. 3B, the magnet moment of the free layer 123A is parallel to the magnet moment of the pinned layer 123B. Under this condition, the reference storage unit 123 is configured to have a low magneto resistance. Effectively, the reference storage unit 123 is programmed to have the bit data having the logic low state.

With continued reference to both of FIG. 1, FIG. 3A, and FIG. 3B, in the embodiments illustrated in FIG. 1, the first terminal, i.e., the free layer 122A, of the reference storage unit 122 is coupled to the reference data line RDL[1], and the second terminal, i.e., the pinned layer 122B, of the reference storage unit 122 is coupled to the average current circuit 131. Furthermore, the first terminal, i.e., the free layer 123A, of the reference storage unit 123 is coupled to the reference data line RDL[2], and the second terminal, i.e., the pinned layer 123B, of the reference storage unit 123 is coupled to the average current circuit 131.

Figure 4:
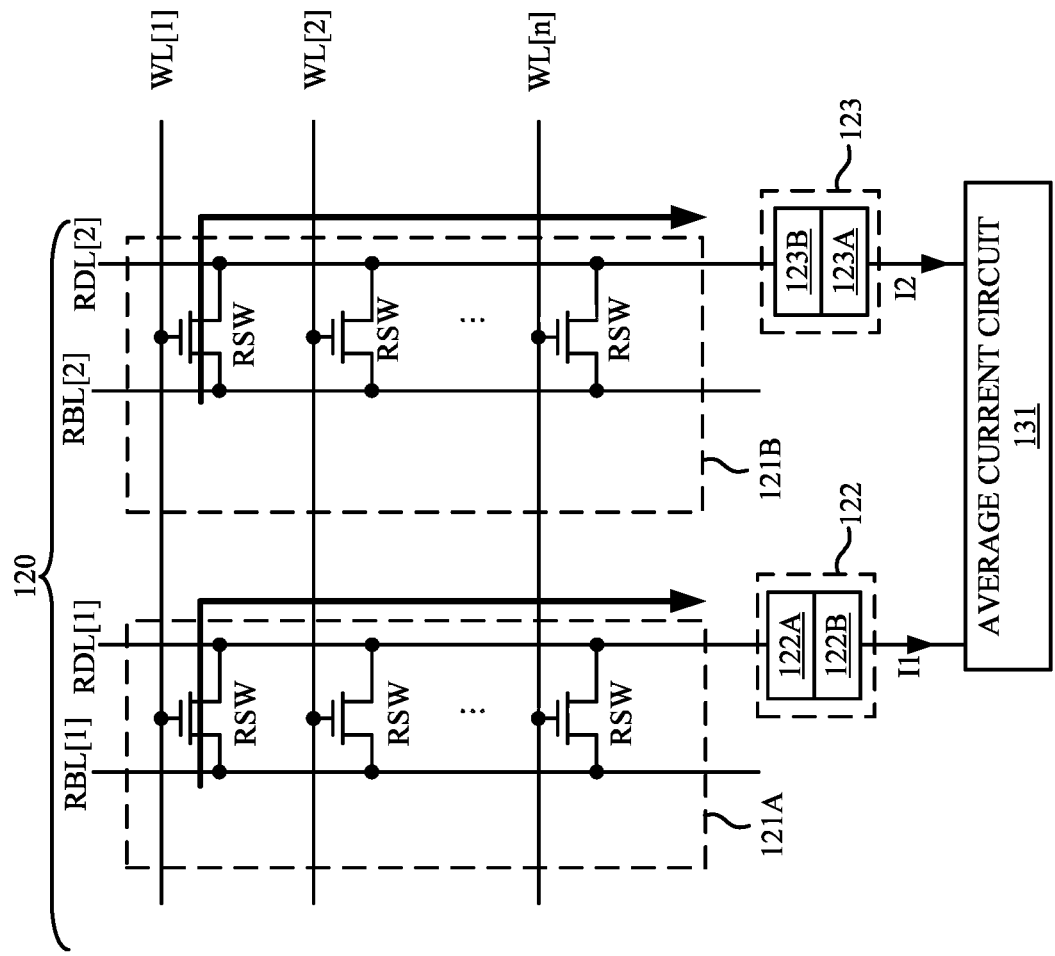
FIG. 4 is a schematic diagram of the reference circuit in FIG. 1, in accordance with some other embodiments of the present disclosure.

FIG. 4 is a schematic diagram of the reference circuit 120 in FIG. 1, in accordance with some other embodiments of the present disclosure. With respect to the embodiment of FIG. 1, like elements in FIG. 4 are designated with the same reference numbers for ease of understanding. Alternatively, in the embodiments illustrated in FIG. 4, the second terminal, i.e., the pinned layer 123B, of the reference storage unit 123 is coupled to the reference data line RDL[2], and the first terminal, i.e., the free layer 123A, of the reference storage unit 123 is coupled to the average current circuit 131. In some embodiments, the arrangement of the reference storage unit 123 in FIG. 4 is achieved in a different layout design.

As illustratively shown in FIG. 4, the current, for the read operation, flows from the pinned layer 123B to the free layer 123A. As described above in FIG. 3B, the current IT2, for the programming operation of the reference storage unit 123, also flows from the pinned layer 123B to the free layer 123A. In other words, in the embodiments illustrated in FIG. 4, the direction of the current for the read operation is the same as the direction of the current for the programming operation. Accordingly, the operational reliability is able to be further improved, compared with the embodiments illustrated in FIG. 1.

Figure 5:
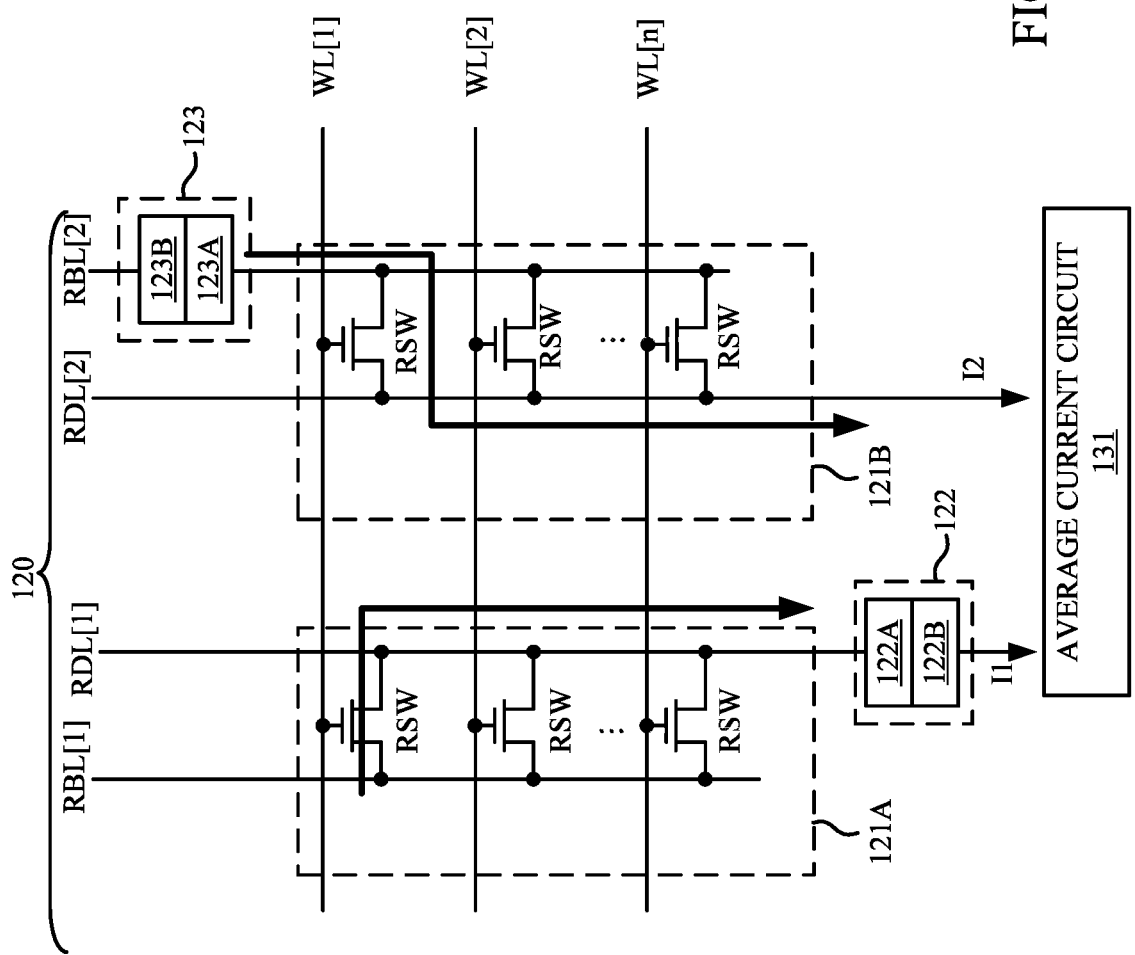
FIG. 5 is a schematic diagram of the reference circuit in FIG. 1, in accordance with some other embodiments of the present disclosure.

FIG. 5 is a schematic diagram of the reference circuit 120 in FIG. 1, in accordance with some other embodiments of the present disclosure. With respect to the embodiment of FIG. 1, like elements in FIG. 5 are designated with the same reference numbers for ease of understanding.

Compared with the reference circuit 120 in FIG. 1, in some embodiments illustrated in FIG. 5, the second terminal, i.e., the pinned layer 123B, of the reference storage unit 123 is coupled to the reference bit line RBL[2], and the first terminal, i.e., the free layer 123A, of the reference storage unit 123 is coupled to the second terminals of the reference switches RSW in the column 121B. The first terminals of the reference switches RSW in the column 121B are coupled to the reference data line RDL[2]. With such arrangements, the direction of the current for the read operation is the same as the direction of the current for the programming operation of the reference storage unit 123. As a result, the operational reliability of the electronic device 100 is further improved.

Figure 6:
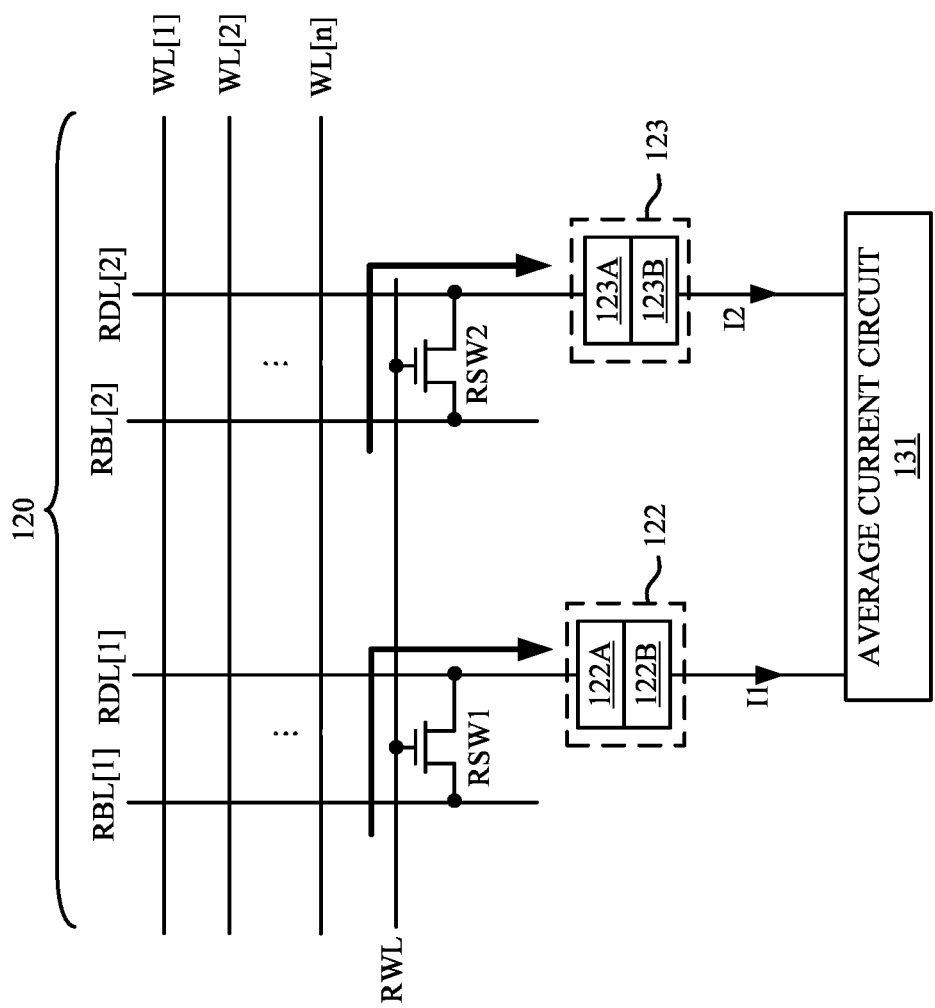
FIG. 6 is a schematic diagram of the reference circuit in FIG. 1, in accordance with still other embodiments of the present disclosure.

Reference is now made to FIG. 6. FIG. 6 is a schematic diagram of the reference circuit 120 in FIG. 1, in accordance with still other embodiments of the present disclosure. With respect to the embodiment of FIG. 1, like elements in FIG. 6 are designated with the same reference numbers for ease of understanding.

Compared with the reference circuit 120 in FIG. 1, in some embodiments illustrated in FIG. 6, the reference circuit 120 further includes a reference word line RWL, and the reference circuit 120 only utilizes two reference switches RSW1 and RSW2. For illustration, a first terminal of the reference switch RSW1 is coupled to the reference bit line RBL[1], a second terminal of the reference switch RSW1 is coupled to the first terminal of the reference storage unit 122, and a control terminal of the reference switch RSW1 is coupled to the reference word line RWL. A first terminal of the reference switch RSW2 is coupled to the reference bit line RBL[2], a second terminal of the reference switch RSW2 is coupled to the first terminal of the reference storage unit 123, and a control terminal of the reference switch RSW2 is coupled to the reference word line RWL. Second terminals of the reference switches are configured to transmit the signals I1 and I2 to the average current circuit 131.

In some embodiments, during the read operation, the reference word line RWL and one of the word lines WL[1]-WL[n] are activated at the same time, in order to transmit the current ICELL and the signals I1 and I2. Alternatively, in some other embodiments, the reference word line RWL is kept being activated. The operations of the reference circuit 120 in FIG. 6 are similar with the operations illustrated in FIG. 2, and the repetitious descriptions are thus not given here.

The configurations of the reference word line RWL is given for illustrative purposes only. Various configurations of the reference word line RWL are within the contemplated scoped of the present disclosure.

Compared with some approaches employing the same architecture of the memory array as the reference circuit, as discussed above, in the embodiments illustrated in FIG. 6, the variations between the reference storage units in the reference circuit 120 are minimized. Accordingly, a more accurate reference signal IREF is able to be generated.

Figure 7:
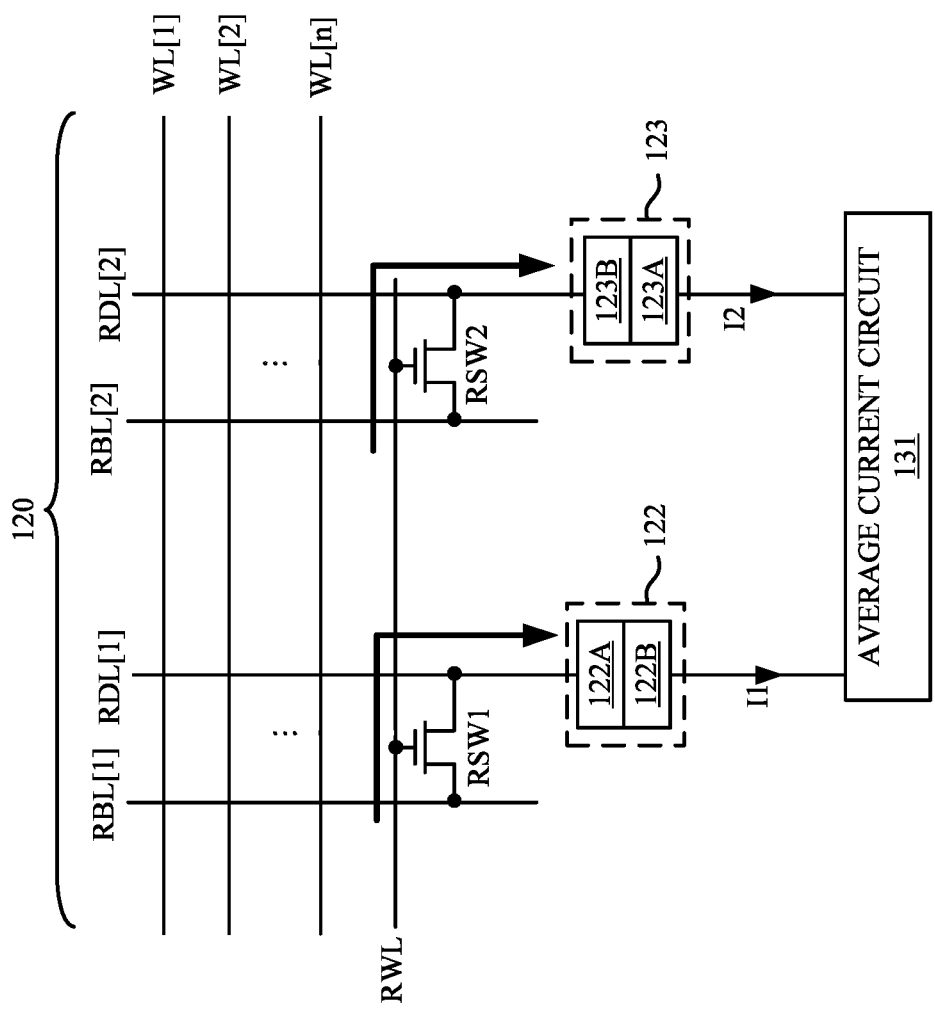
FIG. 7 is a schematic diagram of the reference circuit in FIG. 6, in accordance with various embodiments of the present disclosure.

Reference is now made to both of FIG. 3B and FIG. 7. FIG. 7 is a schematic diagram of the reference circuit 120 in FIG. 6, in accordance with various embodiments of the present disclosure. With respect to the embodiment of FIG. 1, like elements in FIG. 7 are designated with the same reference numbers for ease of understanding.

As illustrated in FIG. 3B, the reference storage unit 123 is able to be implemented with the MTJ device. Compared with the reference circuit 120 in FIG. 6, in some embodiments illustrated in FIG. 7, the second terminal, i.e., the pinned layer 123B in FIG. 3B, of the reference storage unit 123 is coupled to the second terminal of the reference switch RSW2, and the first terminal, i.e., the free layer 123A in FIG. 3B, of the reference storage unit 123 is coupled to the average current circuit 131. As described above, with such arrangements, the direction of the current for the read operation is the same as the direction of the current for the programming operation of the reference storage unit 123. As a result, the operational reliability of the electronic device 100 is further improved.

Figure 8:
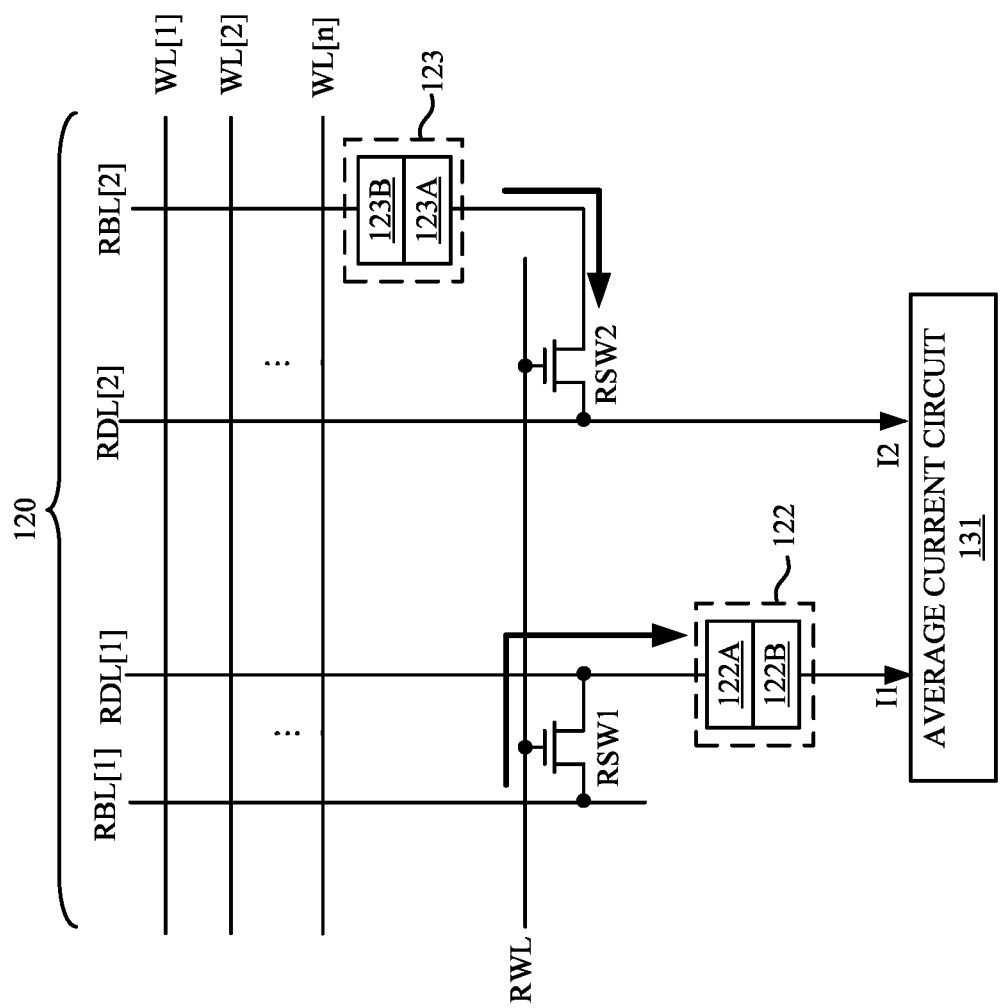
FIG. 8 is a schematic diagram of the reference circuit in FIG. 6, in accordance with various embodiments of the present disclosure.

Reference is now made to both of FIG. 3B and FIG. 8. FIG. 8 is a schematic diagram of the reference circuit 120 in FIG. 6, in accordance with various embodiments of the present disclosure. With respect to the embodiment of FIG. 1, like elements in FIG. 8 are designated with the same reference numbers for ease of understanding.

Compared with the reference circuit 120 in FIG. 6, in some embodiments illustrated in FIG. 8, the second terminal, i.e., the pinned layer 123B, of the reference storage unit 123 is coupled to the reference bit line RBL[2], and the first terminal, i.e., the free layer 123A, of the reference storage unit 123 is coupled to the second terminal of the reference switch RSW2. The first terminal of the reference switch RSW2 is coupled to the reference data line RDL[2]. With such arrangements, the direction of the current for the read operation is the same as the direction of the current for the programming operation of the reference storage unit 123. As a result, the operational reliability of the electronic device 100 is improved.

As described above, the device 100 in the present disclosure is able to generate a reference signal to be compared with the bit data. Moreover, with the arrangements of the reference circuit illustrated in various embodiments, a more accurate reference signal is generated. Accordingly, the operational reliability of the memory device is able to be improved.

In this document, the term "coupled" may also be termed as "electrically coupled," and the term "connected" may be termed as "electrically connected". "Coupled" and "connected" may also be used to indicate that two or more elements cooperate or interact with each other.

In some embodiments, a device is disclosed that includes a first reference storage unit, a second reference storage unit, a first reference switch, and a second reference switch. The first reference switch includes a first terminal coupled to a first reference bit line, a second terminal coupled to the first reference storage unit, and a control terminal coupled a reference word line. The second reference switch includes a first terminal coupled to a second reference bit line, a second terminal coupled to the second reference storage unit, and a control terminal coupled the reference word line. The first reference storage unit is configured to receive a bit data through the first reference switch, and to generate a first signal having a first logic state.

Also disclosed is a method that includes operations below: in response to turning on reference switches, coupling, by the reference switches, reference storage units to reference bit lines with a bit data of a corresponding memory cell; generating, by the reference storage units, a first signal and a second signal different from the first signal; generating, based on the first signal and the second signal, by an average current circuit, a reference signal; and comparing the reference signal with a current indicating the bit data of the corresponding memory cell, by a sense amplifier, to determine a logic state of the bit data of the corresponding memory cell.

Also disclosed is a device that includes reference storage units, reference switches, and a sensing unit. Each of the reference switches includes a first terminal coupled to one of reference bit lines and a second terminal coupled to one of the reference storage units. The reference switches are configured to transmit, at the second terminals of the reference switches, a bit data of a corresponding memory cell in memory cells to the reference storage units. The reference storage units are configured to generate, in response to the reference switches transmitting, a first signal and a second signal. The sensing unit is configured to determine a logic state of the bit data of the corresponding memory cell based on the first signal and the second signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a first reference storage unit and a second reference storage unit;
   a first reference switch configured to output a first current at a first terminal thereof to the first reference storage unit, wherein the first reference storage unit is configured to receive the first current at a first terminal thereof through a first data line and to generate a first signal, according to the first current, at a second terminal thereof to an average current circuit through a conductive line different from the first data line;
   a second reference switch configured to output a second current at a first terminal thereof to the second reference storage unit, wherein the second reference storage unit is configured to receive the second current at a first terminal thereof, and to generate a second signal, according to the second current, at a second terminal thereof to the average current circuit,
   wherein the first and second reference switches are coupled to a plurality of first memory cells by a first word line; and
   a plurality of third reference switches, wherein first terminals of the plurality of third reference switches are coupled to the first terminal of the first reference storage unit through the first data line, and
   second terminals of the plurality of third reference switches are coupled together to a reference bit line different from the conductive line and the first data line.

2. The device of claim 1, wherein when the first word line is activated, the first reference switch is configured to be turned on to transmit a first logic data to the average current circuit, and the second reference switch is configured to be turned on to transmit a second logic data to the average current circuit,
   wherein the first logic data and the second logic data are associate with a bit data stored in a corresponding one of the plurality of first memory cells.

3. The device of claim 2, wherein the first logic data and the second logic data are different from each other.

4. The device of claim 1, further comprising:
   a sense amplifier configured to determine a logic state of a bit data of a corresponding memory cell in the plurality of first memory cells according to a reference signal, generated by the average current circuit, as an average of the first signal and the second signal.

5. The device of claim 1, wherein
   the plurality of third reference switches are coupled to a plurality of second memory cells through a plurality of second word lines,
   wherein the plurality of third reference switches and the first reference switch are arranged in a first column, and the plurality of second memory cells and one of the plurality of first memory cells are arranged in a same column.

6. The device of claim 5, further comprising:
   a plurality of fourth reference switches coupled to the second reference storage unit through a second data line, different from the first data line, and coupled to the plurality of second memory cells through the plurality of second word lines,
   wherein the plurality of fourth reference switches and the second reference switch are arranged in a second column separated from the first column.

7. The device of claim 1, wherein the first reference storage unit is coupled between the first terminal of the first reference switch and the average current circuit, and
   the second reference switch is coupled between the second terminal of the second reference storage unit and the average current circuit.

8. A method comprising:
   generating, by a memory cell, a cell current indicating a bit data of the memory cell;
   turning on a first reference switch of a plurality of reference switches to generate a first signal transmitted through a first data line for generating a second signal, wherein first terminals of the plurality of reference switches are coupled together to a first terminal of a first reference storage unit through the first data line;
   receiving, by a sensing unit, from the first reference storage unit the second signal at a first input terminal of the sensing unit and a third signal from a second reference storage unit at a second input terminal, different from the first input terminal, of the sensing unit to output a reference signal,
   wherein bit data of the first reference storage unit and the second reference storage unit are different; and
   comparing, by the sensing unit, the cell current and the reference signal to determine a logic state of the bit data of the memory cell.

9. The method of claim 8, wherein turning on the first reference switch for generating the second signal comprises:
   biasing the first reference storage unit, by the first reference switch, to generate the second signal.

10. The method of claim 8, further comprising:
    passing a first current flowing from a first layer of the first reference storage unit to a second layer of the first reference storage unit, wherein the first and second layers of the first reference storage unit have different resistive states; and
    passing a second current flowing from a first layer of the second reference storage unit to a second layer of the second reference storage unit, wherein the first and second layers of the second reference storage unit have same resistive state.

11. The method of claim 10, wherein comparing the cell current and the reference signal comprises:
  turning on a switch, that is coupled between the memory cell and the sensing unit, to transmit the cell current to the sensing unit.

12. The method of claim 11, wherein the switch is turned on in response to a selection signal during a read operation.

13. A device, comprising:
  an average current circuit, configured to average a first signal and a second signal to generate a reference signal;
  a first reference switch and a second reference switch that are coupled to a plurality of first memory cells in a row by a word line;
  a first reference storage unit, comprising:
    a first free layer configured to receive a first current from the first reference switch through a first data line; and
    a first pinned layer configured to output the first signal, according to the first current, to the average current circuit through a conductive line different from the first data line, wherein magnet moments of the first free layer and the first pinned layer are anti-parallel;
  a second reference storage unit, comprising:
    a second pinned layer configured to receive a second current from the second reference switch; and
    a second free layer configured to output the second signal, according to the second current, to the average current circuit, wherein magnet moments of the second free layer and the second pinned layer are parallel; and
  a plurality of third reference switches, wherein first terminals of the plurality of third reference switches are coupled to the first free layer through the first data line, and
  second terminals of the plurality of third reference switches are coupled to a first reference bit line different from the first data line and the conductive line.

14. The device of claim 13, further comprising:
  a switch coupled to a first cell of the plurality of first memory cells, and configured to be turned on to transmit a cell current corresponding to a bit data stored in the first cell; and
  a sense amplifier, coupled between the switch and the first cell, and configured to determine a logic state of the bit data according to the reference signal and the cell current.

15. The device of claim 13, wherein the first reference storage unit and the second reference storage unit have different logic states.

16. The device of claim 13, further comprising:
  a plurality of fourth reference switches coupled to the second reference storage unit by a second data line,
  wherein the first reference switch and the plurality of third reference switches are arranged in a first column, and the second reference switch and the plurality of fourth reference switches are arranged in a second column.

17. The device of claim 16, further comprising:
  a plurality of second memory cells each coupled to one of the plurality of third reference switches and one of the plurality of fourth reference switches,
  wherein when the first and second reference switches are turned on, the plurality of third reference switches and the plurality of fourth reference switches are turned off.

18. The device of claim 17, wherein each one in the plurality of second memory cells is configured to store a bit data, and
  the first reference storage unit is configured to be biased by the first reference switch and to receive, through the first reference switch, the bit data for generating the first signal.

19. The device of claim 13, wherein the second reference switch is coupled between a second reference bit line and the second reference storage unit.

20. The method of claim 8, wherein second terminals of the plurality of reference switches are coupled together to a reference bit line.

* * * * *